US012716960B2

(12) United States Patent
Qiu et al.

(10) Patent No.: US 12,716,960 B2
(45) Date of Patent: Aug. 25, 2026

(54) METHOD AND DEVICE FOR DETECTING GROUND SHORT CIRCUIT FAULTS

(71) Applicant: Robert Bosch GmbH, Stuttgart (DE)

(72) Inventors: Xiaofei Qiu, Suzhou (CN); Jin Li, Suzhou (CN); Ruediger Karner, Bietigheim-Bissingen (DE)

(73) Assignee: Robert Bosch GmbH, Stuttgart (DE)

(*) Notice: Subject to any disclaimer, the term of this patent is extended or adjusted under 35 U.S.C. 154(b) by 176 days.

(21) Appl. No.: 18/667,414

(22) Filed: May 17, 2024

(65) Prior Publication Data

US 2024/0393407 A1 Nov. 28, 2024

(30) Foreign Application Priority Data

May 23, 2023 (CN) ........................ 202310589370.2

(51) Int. Cl.

*G01R 31/52* (2020.01)
*G01R 19/10* (2006.01)
*H02H 3/16* (2006.01)
*H02H 7/20* (2006.01)

(52) U.S. Cl.

CPC ............ *G01R 31/52* (2020.01); *G01R 19/10* (2013.01); *H02H 3/16* (2013.01); *H02H 7/20* (2013.01)

(58) Field of Classification Search

CPC ........ G01R 31/50; G01R 31/52; G01R 19/10; H02H 3/16; H02H 7/20

See application file for complete search history.

(56) References Cited

U.S. PATENT DOCUMENTS

2019/0190250 A1* 6/2019 Colarossi ............. H02M 3/155

* cited by examiner

*Primary Examiner* — Douglas X Rodriguez
*Assistant Examiner* — Kendrick X Liu
(74) *Attorney, Agent, or Firm* — Maginot, Moore & Beck LLP

(57) ABSTRACT

A method and device for the detection of short to ground circuits is disclosed. The method includes (i) connecting to a detection current source that is linked to the high-side lead terminal of the two lead terminals of an electronic control circuit, (ii) disconnecting the low-side switch of the ground terminal of the electronic control circuit, (iii) measuring the voltage of the two lead terminals of the electronic control circuit separately, and (iv) determining whether the high-side lead terminal or the low-side lead terminal of the two lead terminals has a short to ground circuit by comparing the voltages of the two lead terminals. When the voltage of the high-side lead terminal is greater than the voltage of the low-side lead terminal, it is determined that the low-side lead terminal has a short to ground circuit. When the voltage of the high-side lead terminal is equal to the voltage of the low-side lead terminal, it is determined that the high-side lead terminal has a short to ground circuit.

10 Claims, 4 Drawing Sheets

METHOD AND DEVICE FOR DETECTING GROUND SHORT CIRCUIT FAULTS

This application claims priority under 35 U.S.C. § 119 to patent application no. CN 2023 1058 9370.2, filed on May 23, 2023 in China, the disclosure of which is incorporated herein by reference in its entirety.

The present disclosure generally relates to the diagnosis of short to ground circuit faults, and more specifically, to a method and device for detecting short to ground circuit faults in an electronic control unit (e.g., an automotive airbag controller).

BACKGROUND

In an automotive electronics system, an electronic control unit (ECU) is connected to a safety device (e.g., an airbag, a fuel cut-off device, etc.). When the ECU determines that a collision event has occurred, it activates at least one safety device. For example, the ECU inflates the airbag upon determining that a collision event has occurred, thereby protecting the occupants from impact.

In an environment where the vehicle body is grounded, the two lead terminals of the ECU are prone to a short to ground circuit, which can cause safety devices to fail to operate normally (e.g., the airbag cannot be inflated normally), posing a potential safety hazard. Therefore, there is a need to regularly inspect for short circuit faults. Conventional short fault diagnosis can only determine a short to ground circuit through identifying that the voltage at the lead end terminal of the ECU is less than a specific threshold (e.g., 0.8 V), but cannot determine the particular lead terminal at which the short to ground circuit occurs.

In order to improve the efficiency of vehicle fault detection and repair, it is necessary to determine which lead terminal of the ECU has a short to ground circuit.

SUMMARY

The following introduction is provided in order to introduce selected concepts in a simple manner, and these concepts will be further described in the detailed description below. The introduction is not intended to highlight the key or necessary features of the claimed subject matter, nor is it intended to limit the scope of the claimed subject matter.

In order to improve the efficiency of vehicle fault detection and repair, and quickly diagnose the specific lead terminal of the ECU where a short to ground circuit has occurred, the present disclosure introduces a detection current source that provides a constant current between the two lead terminals of the ECU, thereby creating a voltage difference across the load at both ends. When a short to ground circuit occurs at either lead terminal of the ECU, the specific lead terminal in which the short to ground circuit occurs is determined by detecting whether there is a voltage difference across the load at both ends.

Embodiments of the present disclosure provide a method for detecting a short to ground circuit, comprising: connecting to a detection current source that is linked to the high-side lead terminal of the two lead terminals of an electronic control circuit; disconnecting the low-side switch of the ground terminal of the electronic control circuit; measuring the voltage of the two lead terminals of the electronic control circuit separately; and determining whether the high-side lead terminal or the low-side lead terminal of the two lead terminals has a short to ground circuit by comparing the voltages of the two lead terminals. Wherein, when the voltage of the high-side lead terminal is greater than the voltage of the low-side lead terminal, it is determined that the low-side lead terminal has a short to ground circuit; when the voltage of the high-side lead terminal is equal to the voltage of the low-side lead terminal, it is determined that the high-side lead terminal has a short to ground circuit.

Embodiments of the present disclosure provide a device for detecting a short to ground circuit, comprising: a detection current source that is linked to the high-side lead terminal of the two lead terminals of an electronic control circuit; a low-side switch used to control the connection or disconnection of the ground terminal of the electronic control circuit; a measurement module used to measure the voltage of the two lead terminals of the electronic control circuit separately when the detection current source is connected and the low-side switch is disconnected; and a comparison module used to determine whether the high-side lead terminal or the low-side lead terminal of the two lead terminals has a short to ground circuit by comparing the voltages of the two lead terminals. Wherein, when the voltage of the high-side lead terminal is greater than the voltage of the low-side lead terminal, it is determined that the low-side lead terminal has a short to ground circuit; when the voltage of the high-side lead terminal is equal to the voltage of the low-side lead terminal, it is determined that the high-side lead terminal has a short to ground circuit.

Compared to conventional short to ground circuit fault detection, the present disclosure can not only diagnose short to ground circuit fault at the lead terminal of the ECU, but also quickly identify the specific lead terminal at which the short to ground circuit occurs, thereby facilitating repair failure, greatly improving fault detection and repair efficiency, improving user experience, and making hardware structure simple and less costly.

BRIEF DESCRIPTION OF THE DRAWINGS

The nature and advantages of the content of the present disclosure may be further understood by referring to the following accompanying drawings. In the accompanying drawings, similar assemblies or features may have the same reference numerals.

DETAILED DESCRIPTION

The subject matter described herein will now be discussed with reference to exemplary embodiments. It should be understood that discussions about these embodiments are provided to aid those skilled in the art in better understanding and thereby implementing the subject matter described herein rather than limiting the scope of protection, applicability, or examples described in the Claims. Changes may be made to the functions and arrangements of the elements discussed without departing from the scope of protection of the content of the present disclosure. Various processes or assemblies may be omitted, substituted, or added in the various examples as needed. For example, the described methods may be performed in a different order than that described, and various steps may be added, omitted, or combined. In addition, features described in relation to some examples may also be combined in other examples.

Figure 1:
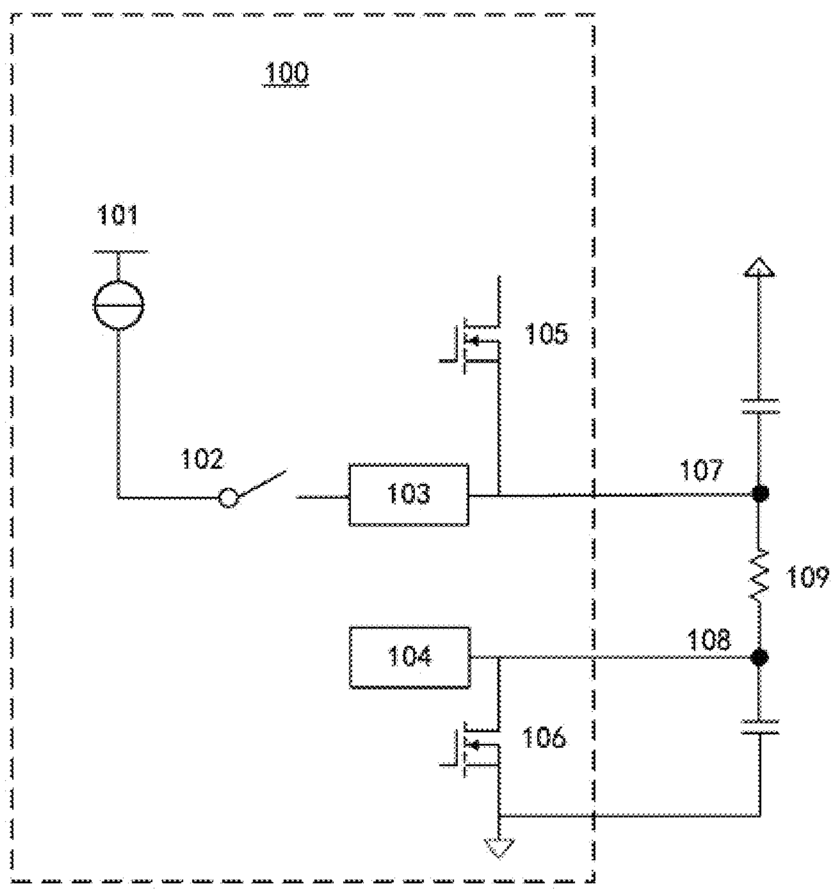
FIG. 1 shows a schematic diagram of an electronic control circuit for detecting a short to ground circuit.

FIG. 1 shows a schematic diagram of an electronic control circuit 100 for detecting a short to ground circuit.

The electronic control circuit 100 shown in FIG. 1 comprises: a detection current source 101 and its switch 102, voltage divider bias circuits 103 and 104, a high-side switch 105, a low-side switch 106, high-side lead terminal 107, and low-side lead terminal 108. The electronic control circuit 100 is typically connected to an external load 109 (e.g., an airbag, represented by its equivalent resistance in FIG. 1).

The voltage divider bias circuits 103 and 104 maintain the normal output voltage of the high-side lead terminal 107 and the low-side lead terminal 108 at a preset value (e.g., 1.25 V).

The high-side switch 105 is linked to the power supply of the electronic control circuit 100 and the low-side switch 106 is connected to the ground terminal (GND). For example, the high-side switch 105 and the low-side switch 106 may be implemented with a metal-oxide-semiconductor field-effect transistor (MOSFET). When the high-side switch 105 and the low-side switch 106 are turned on simultaneously, they respectively provide power and ground to the load 109 through the high-side lead terminal 107 and the low-side lead terminal 108, triggering and operating load 109. For example, when a collision event occurs, the electronic control circuit 100 turns on both high-side switch 105 and low-side switch 106, providing power to the load 109 (e.g., an airbag) through the high-side lead terminal 107 and the low-side lead terminal 108, causing it to inflate. This provides safety protection to the vehicle occupants, protecting them from impact.

A detection current source 101 for providing a constant current (e.g., 40 mA) is connected to the high-side lead terminal 107 of the electronic control circuit 100. The detection current source 101 may be disposed inside (as shown in FIG. 1) or outside (not shown) of the electronic control circuit 100.

When short to ground circuit detection is performed, the connection to the detection current source 101 is established by closing the switch 102. The low-side switch 106 is turned off. Preferably, both the low-side switch 106 and the high-side switch 105 are both turned off. The voltage of the high-side lead terminal 107 and the low-side lead terminal 108 are then measured separately. By comparing the voltages of the high-side lead terminal 107 and the low-side lead terminal 108, it is determined whether the high-side lead terminal 107 or the low-side lead terminal 108 has a short to ground circuit. Specifically, if the voltage of the high-side lead terminal 107 is greater than the voltage of the low-side lead terminal 108, it is determined that the low-side lead terminal 108 has a short to ground circuit; if the voltage of the high-side lead terminal 107 is equal to the voltage of the low-side lead terminal 108, it is determined that the high-side lead terminal 107 has a short to ground circuit.

Figure 2A:
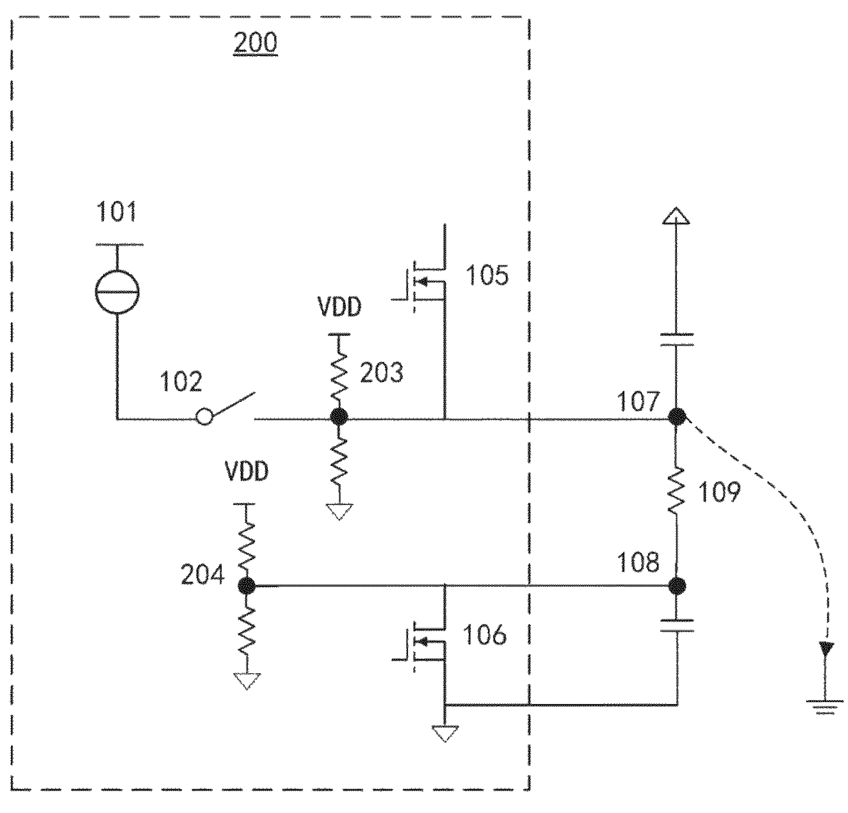
FIG. 2A shows a schematic diagram of a circuit for detecting a short to ground circuit according to an example of the present disclosure.

FIG. 2A shows a schematic diagram of a circuit for detecting a short to ground circuit according to an example of the present disclosure. FIG. 2A illustrates the occurrence of a short to ground circuit at the high-side lead terminal 107.

The electronic control circuit 200 of FIG. 2A is substantially similar to the ECU 100 of FIG. 1, with the difference between the two as follows: the voltage divider bias circuits 203 and 204 in the electronic control circuit 200 are implemented using resistors. Optionally, the voltage divider bias circuits 203 and 204 may also be implemented using MOSFETs, triodes or the like.

Once a conventional fault self-diagnosis system detects that the voltage of the high-side lead terminal 107 and the low-side lead terminal 108 is less than a threshold (e.g., 0.8 V), the electronic control circuit 200 enters the following short to ground circuit diagnosis mode.

First, the switch 102 is closed, connecting the detection current source 101.

Next, the low-side switch 106 is turned off. Preferably, both the low-side switch 106 and the high-side switch 107 are both turned off. The purpose is to avoid triggering the load (e.g., accidentally inflating the airbag).

The voltage of the high-side lead terminal 107 and the low-side lead terminal 108 are then measured separately.

Finally, by comparing the voltages of the high-side lead terminal 107 and the low-side lead terminal 108, it is determined whether the high-side lead terminal 107 or the low-side lead terminal 108 has a short to ground circuit.

As shown in FIG. 2A, when the high-side lead terminal 107 has a short to ground circuit, the current output by the detection current source 101 passes through the high-side lead terminal 107 to the ground, and no current flows through the load 109. Therefore, the voltage of the high-side lead terminal 107 is equal to the voltage of the low-side lead terminal 108. Thus, when the voltage of the high-side lead terminal 107 is equal to the voltage of the low-side lead terminal 108, it can be determined that a short to ground circuit has occurred at the high-side lead terminal 107.

Figure 2B:
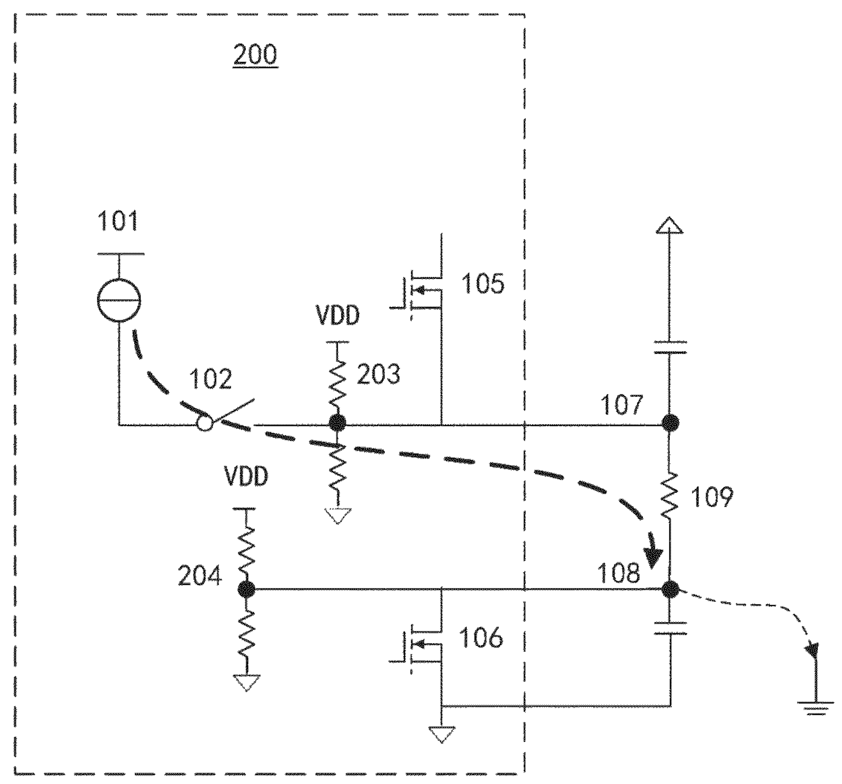
FIG. 2B shows a schematic diagram of a circuit for detecting a short to ground circuit according to another example of the present disclosure.

FIG. 2B shows a schematic diagram of a circuit for detecting a short to ground circuit according to another example of the present disclosure. FIG. 2B illustrates the occurrence of a short to ground circuit at the low-side lead terminal 108.

The electronic control circuit 200 of FIG. 2B is substantially similar to the electronic control circuit 200 of FIG. 2A.

As shown in FIG. 2B, when the low-side lead terminal 108 has a short to ground circuit, the current output by the detection current source 101 passes through the high-side lead terminal 107, the load 109 and the low-side lead terminal 108 to the ground. At this point, there is a current flowing through the load 109, thereby creating a voltage difference across the load 109. That is, the voltage of the high-side lead terminal 107 is greater than the voltage of the low-side lead terminal 108. Thus, when the voltage of the high-side lead terminal 107 is greater than the voltage of the low-side lead terminal 108, it can be determined that a short to ground circuit has occurred at the low-side lead terminal 108.

Figure 3:
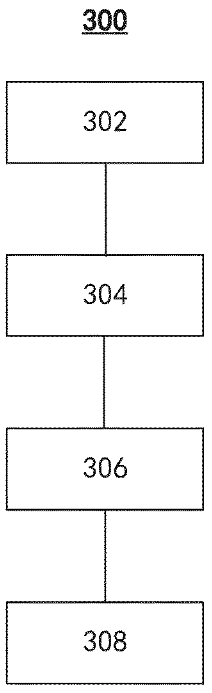
FIG. 3 shows a method flow chart for detecting a short to ground circuit according to one example of the present disclosure.

FIG. 3 shows a method flow chart 300 for detecting a short to ground circuit according to one example of the present disclosure. The method flow chart 300 may be implemented using the electronic control circuit 100 shown in FIG. 1 or the electronic control circuit 200 shown in FIGS. 2A-2B, and it comprises a plurality of steps 302-308.

In step 302, the switch 102 is closed, connecting the detection current source 101.

In step 304, the low-side switch 106 is turned off. Preferably, in step 304, both the low-side switch 106 and the high-side switch 107 are both turned off.

In step 306, the voltage of the high-side lead terminal 107 and the low-side lead terminal 108 are measured separately.

In step 308, by comparing the voltages of the high-side lead terminal 107 and the low-side lead terminal 108, it is determined whether the high-side lead terminal 107 or the low-side lead terminal 108 has a short to ground circuit. Specifically, when the voltage of the high-side lead terminal 107 is greater than the voltage of the low-side lead terminal 108, it is determined that the low-side lead terminal 108 has a short to ground circuit; when the voltage of the high-side lead terminal 107 is equal to the voltage of the low-side lead terminal 108, it is determined that the high-side lead terminal 107 has a short to ground circuit.

The various components in the various examples of the present disclosure may be fully integrated into one processing unit, or each unit may be separately implemented as an individual unit, or two or more units may be integrated into one unit; the aforementioned integrated units may be implemented in the form of hardware and may also be implemented in the form of functional units of hardware plus software. For example, the electronic control circuit may be a microcontroller unit (MCU), or system-on-chip (SOC), field-programmable gate array (FPGA), application-specific integrated circuit (ASIC), or the like.

Exemplary embodiments are described above with reference to the specific examples described in the accompanying drawings, but do not represent all examples that may be implemented or fall within the scope of protection of the Claims. Throughout the present Specification, the term "exemplary" means "serving as an example, instance, or illustration" and does not imply "preferred" or "advantageous" over other examples. Specific embodiments include specific details to facilitate understanding of the described technology. However, these technologies may be implemented without these specific details. In some instances, to avoid causing difficulties in understanding the concepts of the described examples, known structures and devices are shown in block diagram form.

The aforementioned description of the present disclosure is provided to allow any person of ordinary skill in the art to implement or use the present disclosure. Various modifications to the present disclosure will be apparent to those of ordinary skill in the art, and the general principles defined herein may be applied to other variations without departing from the scope of protection of the present disclosure. Therefore, the present disclosure is not limited to the exemplary examples and designs described herein but is consistent with the broadest scope defined by the principles and novel features disclosed herein.

What is claimed is:

1. A method for detecting a short to ground circuit, comprising:

connecting to a detection current source that is linked to a high-side lead terminal of two lead terminals of an electronic control circuit;

disconnecting a low-side switch of a ground terminal of the electronic control circuit;

measuring voltage of the two lead terminals of the electronic control circuit separately with the detection current source linked to the high-side lead terminal and with the low-side switch disconnected; and determining whether the high-side lead terminal or the low-side lead terminal of the two lead terminals has a short to ground circuit by comparing voltages of the two lead terminals to each other.

2. The method according to claim 1, wherein the step of disconnecting the low-side switch of the ground terminal of the electronic control circuit further comprises:

disconnecting a high-side switch of a power terminal of the electronic control circuit.

3. The method according to claim 1, wherein determining whether the high-side lead terminal or the low-side lead terminal of the two lead terminals has a short to ground circuit comprises:

determining that the low-side lead terminal has a short to ground circuit when voltage at the high-side lead terminal is greater than voltage at the low-side lead terminal.

4. The method according to claim 1, wherein determining whether the high-side lead terminal or the low-side lead terminal of the two lead terminals has a short to ground comprises:

determining that the high-side lead terminal has a short to ground circuit when voltage at the high-side lead terminal is equal to voltage at the low-side lead terminal.

5. The method according to claim 1, wherein the detection current source is disposed inside or outside the electronic control circuit.

6. A device for detecting a short to ground circuit, comprising:

a detection current source that is linked to a high-side lead terminal of two lead terminals of an electronic control circuit;

a low-side switch configured to control connection or disconnection of a ground terminal of the electronic control circuit;

a measurement module configured to measure voltage of the two lead terminals of the electronic control circuit separately when the detection current source is connected and the low-side switch is disconnected; and a comparison module configured to determine whether the high-side lead terminal or the low-side lead terminal of the two lead terminals has a short to ground circuit by comparing voltages of the two lead terminals to each other, wherein the compared voltages are measured with the detection current source connected and the low-side switch disconnected.

7. The device according to claim 6, further comprising a high-side switch configured to control connection or disconnection of a power supply of the electronic control circuit, wherein:

the measurement module is configured to measure voltage of the two lead terminals of the electronic control circuit separately when the detection current source is connected and both the low-side switch and the high-side switch are disconnected.

8. The device according to claim 6, wherein the comparison module is configured to determine whether the low-side lead terminal has a short to ground circuit when voltage at the high-side lead terminal is greater than voltage at the low-side lead terminal.

9. The device according to claim 6, wherein the comparison module is configured to determine whether the high-side lead terminal has a short to ground circuit when voltage at the high-side lead terminal is equal to voltage at the low-side lead terminal.

10. The device according to claim 6, wherein the detection current source is disposed inside or outside the electronic control circuit.

* * * * *